(12) United States Patent
Kim (10) Patent No.: US 7,154,322 B2
(45) Date of Patent: Dec. 26, 2006

(54) DELAY SIGNAL GENERATOR CIRCUIT AND MEMORY SYSTEM INCLUDING THE SAME

(75) Inventor: Kyoung-Park Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/039,609

(22) Filed: Jan. 20, 2005

(65) Prior Publication Data
US 2005/0156647 A1    Jul. 21, 2005

(30) Foreign Application Priority Data
Jan. 20, 2004    (KR) ...................... 10-2004-0004072

(51) Int. Cl.
*H03H 11/26*    (2006.01)
(52) U.S. Cl. ...................... 327/276; 327/277
(58) Field of Classification Search ................ 327/276, 327/277, 261, 262, 184, 185, 158, 3; 713/500
See application file for complete search history.

(56) References Cited

U.S. PATENT DOCUMENTS

| | | | |
|---|---|---|---|
| 6,847,241 B1 * | 1/2005 | Nguyen et al. ............. | 327/158 |
| 6,876,239 B1 * | 4/2005 | Bell ........................... | 327/158 |
| 6,949,958 B1 * | 9/2005 | Zerbe et al. ................... | 327/3 |
| 6,999,547 B1 * | 2/2006 | Braceras et al. ............ | 375/371 |
| 2001/0026183 A1 * | 10/2001 | Kim ........................... | 327/276 |
| 2003/0001634 A1 * | 1/2003 | Cao et al. ................... | 327/158 |
| 2006/0066368 A1 * | 3/2006 | Gabato et al. .............. | 327/158 |

* cited by examiner

*Primary Examiner*—Quan Tra
*Assistant Examiner*—Rey Aranda
(74) *Attorney, Agent, or Firm*—F. Chau & Associates, LLC (57) ABSTRACT

A delay signal generator circuit is provided. A delay circuit including a plurality of series-connected inverters for sequentially delaying a first clock signal and for generating a plurality of delay signals and a multiplexer for selecting one of the delay signals. A delay control circuit samples the selected delay signal in response to a transition of a second clock signal. The second clock signal has twice the frequency of the first clock signal, and the delay control circuit controls the delay circuit based upon the sampled value(s) so that the selected delay signal output from the delay circuit has a delay time of ¼ clock cycle relative to the first clock signal.

48 Claims, 8 Drawing Sheets

DELAY SIGNAL GENERATOR CIRCUIT AND MEMORY SYSTEM INCLUDING THE SAME

FIELD OF THE INVENTION

The present invention relates to semiconductor integrated circuits, and more specifically, to a circuit for generating stable delayed clock signals, (e.g. for memory devices), despite variations in process, supply voltage and temperature.

BACKGROUND OF THE INVENTION

Double data rate (DDR) memory devices can read or write data on both the positive and negative edges (transitions) of a clock signal. Thus, DDR memory provides twice the data rate of memory devices (e.g., SDRAM) that can only read or write data on the positive edge of a clock signal. The main difference between DDR and SDRAM memory is that DDR reads data on both the rising and falling edges of the clock signal. SDRAM only carries information on the rising edge of a signal. This allows the DDR module to transfer data twice as fast as SDRAM. For example, instead of a data rate of 133 MHz, DDR memory transfers data at 266 MHz.

A memory controller may be utilized for interfacing a processor with DDR memory devices. The memory controller supplies write data, a write data strobe, and a write command to a DDR memory with a proper timing relation so that data is reliably written in the memory. During a read operation, the memory controller is further used to fetch data read out from the DDR memory.

Figure 1:
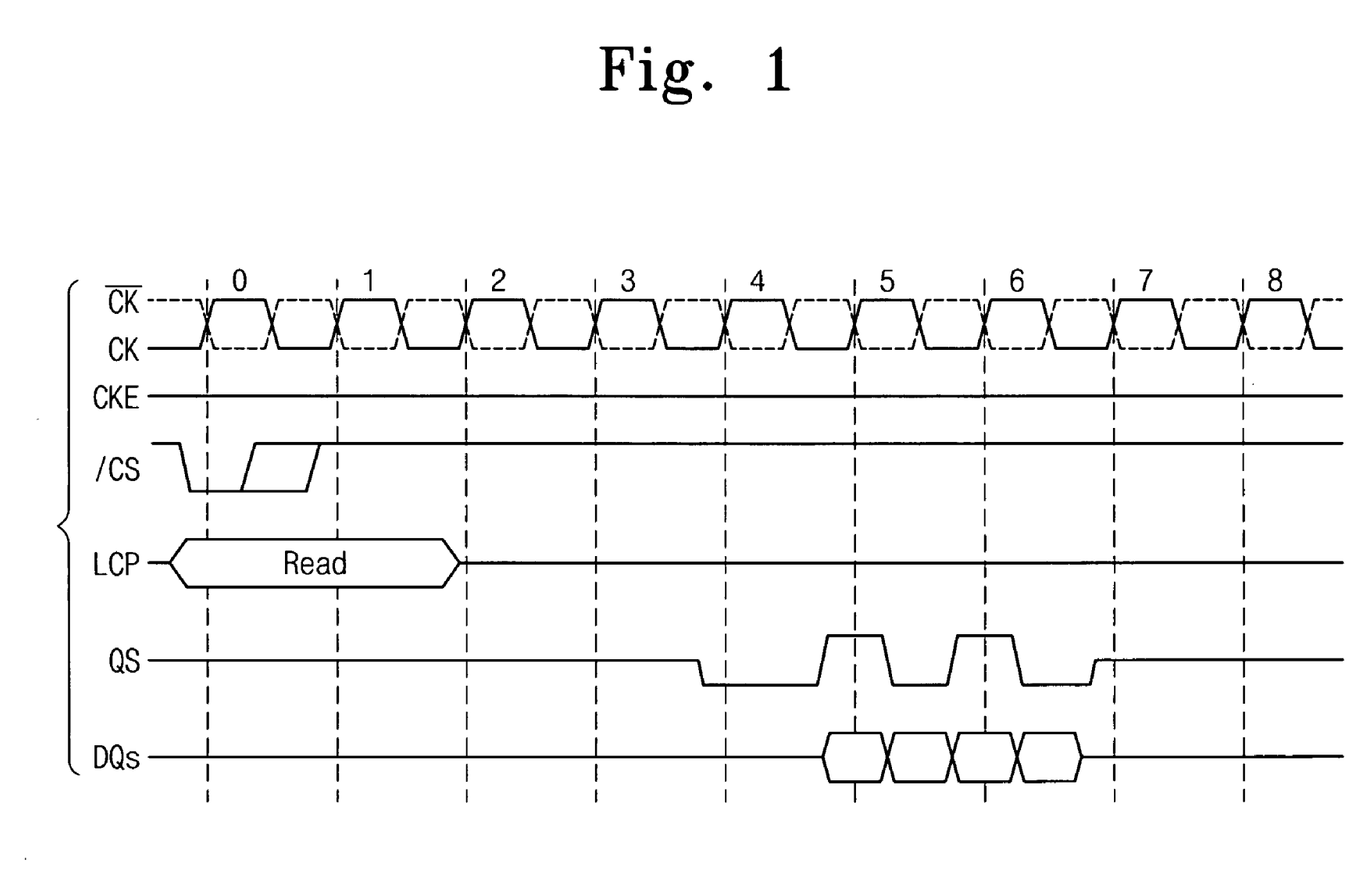
FIG. 1 is a timing diagram showing a burst read operation of a conventional memory device.

During a read operation, as illustrated in FIG. 1, a DDR memory performs the read operation in a well-known manner when a/CS signal goes low and a read command is received. After a time elapses, the DDR memory outputs read data along with a read data strobe signal. And then, a memory controller receives the read data with the read data strobe from the DDR memory. The DDR memory outputs the read data strobe QS coincident with the read data DQs. In other words, the read data strobe QS is coincident with the read data DQs. The read data strobe QS is a signal that is generated in the DDR memory by use of a clock signal CK. One problem, as illustrated in FIG. 1, is that the read data strobe QS is not synchronized with the clock signal CK. The memory controller delays the read data strobe QS by a ¼ clock cycle and fetches data on both positive and negative edges of the delayed read data strobe QS. Accordingly, it is necessary to accurately delay a read data strobe QS by a ¼ clock cycle in the memory controller. Hereinafter, the read data strobe delayed by a ¼ clock cycle is called a ¼ delayed read data strobe.

It is possible to generate the ¼ delayed read data strobe by use of an inverter delay circuit and a delay locked loop (DLL) circuit. A DLL circuit precisely secures a delay time while consuming power over 30 mW. An inverter delay circuit consumes a relatively smaller amount of power while securing the delay time with less precision. This is because a delay time of the inverter delay circuit depends on (manufacturing) process, (power supply) voltage and (circuit) temperature variations, as is illustrated in FIG. 2.

Figure 2:
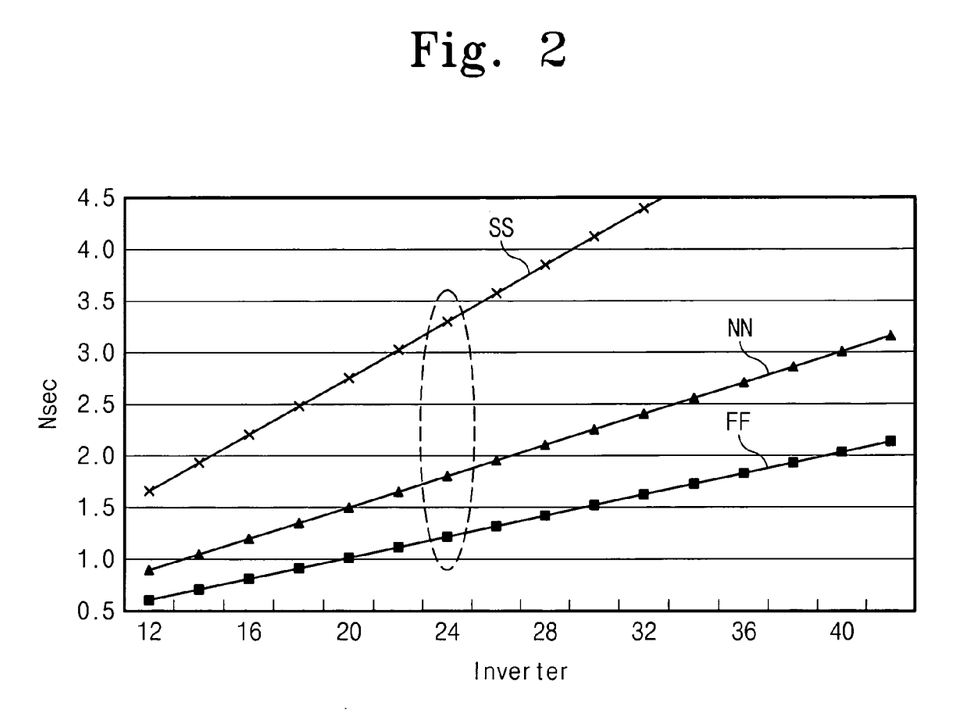
FIG. 2 is a graph for illustrating the affect of variation in process upon the delay time of an inverter chain.

FIG. 2 is a graph that shows the relationship between the number of inverters (connected in series) of three (manufacturing) process types (SS, NN, FF) and a resulting delay time. For example, if an inverter delay circuit consists of 24 inverters fabricated under a process condition of NN, the expected delay time of each the inverter delay circuit will be 1.8 nanoseconds (Nsec, ns).

The label "FF" means that each inverter consists of a fast NMOS transistor and a fast PMOS transistor; "NN" means that an inverter consists of a typical NMOS transistor and a typical PMOS transistor; and "SS" means that an inverter consists of a slow NMOS transistor and a slow PMOS transistor. It is understood from FIG. 2 that a delay time is depends upon the process used to form the inverters in the delay line. For example, a delay time of an inverter delay circuit is relatively longer using inverters made under the SS process condition and relatively shorter using inverters made under the FF process condition. In other words, the delay time of an inverter delay circuit depends upon process variations. This means that it may be difficult to precisely obtain a desired delay time unless the process used to form the inverters is precisely and consistently controlled. Furthermore, as well known by persons skilled in the art, it's the delay time of an inverter delay circuit varies dynamically depending upon variations in temperature and (supply) voltage (PVT).

As a result, it is difficult to generate a precisely specified stable delay signal using an inverter delay circuit.

SUMMARY OF THE INVENTION

It is therefore an object of the invention to provide a DDR memory system including an inverter-based delay circuit capable of generating a precise and stable delay signal regardless of process, and without being affected by variations in voltage and temperature.

In accordance with one aspect of the present invention, a delay signal generator circuit is provided which comprises a delay circuit for sequentially delaying a first clock signal to generate a plurality of delay signals and for outputting one of the delay signals; and a delay control circuit for sampling a delay signal outputted from the delay circuit in response to a transition of a second clock signal. The second clock signal has twice a frequency of the first clock signal, and the delay control circuit controls the delay circuit according to the sampled value so that a delay signal from the delay circuit has an increased/decreased delay time.

In an exemplary embodiment, the transition of the second clock signal is either one of a high-to-low transition and a low-to-high transition. The delay circuit comprises serially-connected inverters, the delay control circuit compensating a delay time due to process variations of the inverters according to the sampled value. The delay control circuit controls the delay circuit so that a delay signal from the delay circuit is delayed by a ¼ cycle to the first clock signal. When a delay time of a delay signal from the delay circuit is shorter than the ¼ cycle, the delay control circuit controls the delay circuit so that a delay time of the delay signal is increased. When a delay time of a delay signal from the delay circuit is longer than the ¼ cycle, the delay control circuit controls the delay circuit so that a delay time of the delay signal is decreased. After a setup interval where a delay signal from the delay circuit is set so as to be delayed by a ¼ cycle to the first clock signal, supplying of the first and second clock signals is cut off for suspension of the sampling operation. After the setup interval, the delay circuit delays an external input signal by a delay time determined during the setup interval.

Alternatively, after a setup interval where a delay signal from the delay circuit is set so as to be delayed by a ¼ cycle to the first clock signal, supplying of the second clock signal is cut off for suspension of the sampling operation.

In an exemplary embodiment, after the setup interval, the delay control circuit controls the delay circuit according to temperature and voltage variation information so that a delay time of a delay signal from the delay circuit is increased/decreased.

In accordance with another aspect of the present invention, a memory system is provided which comprises a memory for outputting data along with a data strobe signal coincident with a first clock signal; and a memory controller for receiving the data from the memory in response to the data strobe signal. The memory controller comprises a data input circuit for receiving the data in response to a data input clock signal; a delay circuit for sequentially delaying the first clock signal to generate a plurality of delay signals, one of the delay signals being outputted as the data input clock signal; and a delay control circuit for sampling a delay signal from the delay circuit in response to a transition of a second clock signal having twice a frequency of the first clock signal, the delay control circuit controlling the delay circuit according to the sampled value so that a delay signal from the delay circuit has an increased/decreased delay time.

In an exemplary embodiment, the transition of the second clock signal has either one of a high-to-low transition and a low-to-high transition.

In an exemplary embodiment, the delay circuit comprises serially-connected inverters, the delay control circuit compensating a delay time due to process variations of the inverters according to the sampled value.

In an exemplary embodiment, the delay control circuit controls the delay circuit so that a delay signal from the delay circuit is delayed by a ¼ cycle to the first clock signal.

In an exemplary embodiment, when a delay time of a delay signal from the delay circuit is shorter than the ¼ cycle, the delay control circuit controls the delay circuit so that a delay time of the delay signal is increased.

In an exemplary embodiment, when a delay time of a delay signal from the delay circuit is longer than the ¼ cycle, the delay control circuit controls the delay circuit so that a delay time of the delay signal is decreased.

In an exemplary embodiment, after a setup interval where a delay signal from the delay circuit is set so as to be delayed by a ¼ cycle to the first clock signal, supplying of the first and second clock signals is cut off for suspension of the sampling operation.

In an exemplary embodiment, after the setup interval, the delay circuit delays an external input signal by a delay time determined during the setup interval.

In an exemplary embodiment, after a setup interval where a delay signal from the delay circuit is set so as to be delayed by a ¼ cycle to the first clock signal, supplying of the second clock signal is cut off for suspension of the sampling operation.

In an exemplary embodiment, after the setup interval, the delay control circuit controls the delay circuit according to temperature and voltage variation information so that a delay time of a delay signal from the delay circuit is increased/decreased.

BRIEF DESCRIPTION OF THE DRAWINGS

The present invention will become better understood by reference to the following detailed description of the preferred embodiments when considered in conjunction with the accompanying drawings in which like reference symbols indicate the same or similar components, wherein.

DESCRIPTION OF PREFERRED EMBODIMENTS OF THE INVENTION

The preferred embodiments of the invention will be more fully described with reference to the attached drawings.

Figure 3:
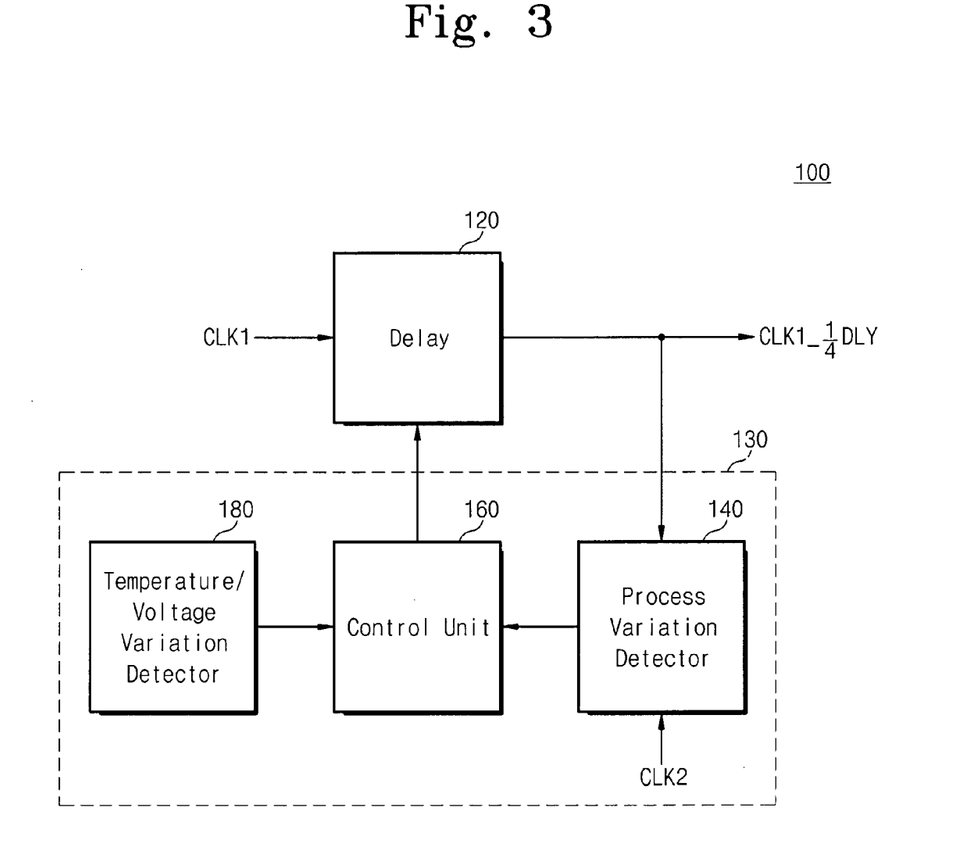
FIG. 3 is a schematic block diagram showing a delay signal generator circuit according to an exemplary embodiment of the present invention.

FIG. 3 is a schematic block diagram showing a delay signal generator circuit according to an embodiment of the present invention. Referring to FIG. 3, the present delay signal generator circuit 100 responds to first and second clock signals CLK1 and CLK2 to generate a delay clock signal CLK1_¼DLY, which is delayed by a ¼ clock cycle to the first clock signal CLK1. The period of the first clock signal CLK1 is twice the period of the second clock signal CLK2. In other words, the frequency of the second clock signal CLK2 is twice that the frequency of the first clock signal CLK1. The delay signal generator circuit 100 uses inverters to generate the delay clock signal CLK1_¼DLY, but the resulting delay clock signal CLK1_¼DLY is stably generated to have the required delay time (e.g., a time delayed by a ¼ clock cycle relative to the first clock signal CLK1) regardless of power, voltage and temperature (PVT) variations, as will be more fully described below.

The present delay signal generator circuit 100 includes a delay block (including an inverter-based delay circuit) 120, a process variation detector block 140, and a control unit 160. The delay block 120 (including an inverter-based delay circuit) sequentially delays the first clock signal CLK1 to generate a plurality of delay signals. (see e.g., CLK1D1, CLK1D2 etc. in FIG. 4) The delay block 120 outputs a dynamically selected one of the delay signals as the delay clock signal CLK1_¼DLY under the control of the control unit 160. The process variation detector block 140 samples a delay signal (e.g., the delay clock signal CLK1_¼DLY) from the delay block 120 in response to the second clock signal CLK2. For example, the process variation detector block 140 samples a delay signal CLK1_¼DLY from the delay block 120 in response to a high-to-low transition of the second clock signal CLK2. The control unit 160 controls the delay block 120 according to values sampled by the process variation detector block 140 so that a delay time of a delay signal from the delay block 120 is adjusted to compensate for variation in the process used to form the inverters in the delay block 120.

With this feedback scheme, a delay time of a delay signal CLK1_¼DLY from the delay block 120 can be increased or decreased according to a sampled value. Ultimately, a delay clock signal CLK1_¼DLY from the delay block 120 is delayed by ¼ clock cycle relative to the first clock signal CLK1. In other words, the delay block 120 is calibrated by the process variation detector block 140 and by the control unit 160 so as to have a delay time corresponding to a ¼ clock cycle relative to the first clock signal CLK1.

After a delay time of the delay block 120 is set to a required time, the process variation detector block 140 does not need to be operated and supplying of the second clock signal CLK2 may be stopped. The process variation detector block 140 may cease to operate. The interval of time while the delay time of the delay block 120 is being set to a desired time is called a setup interval. During the setup interval, the actual delay time of the delay signal output by the delay block 120, which may need calibration due to process variation, is revised. After the setup interval, the delay signal generator circuit 100 is capable of further revising the delay time output of the delay block 120, which may be varied due to temperature and voltage variations, by employing a temperature/voltage variation detector block 180 as will be more fully described below.

After the setup interval, the temperature/voltage variation detector block 180 detects variations of temperature and voltage in the delay signal generator circuit 100 and sends the detected temperature/voltage variation information to the control unit 160. The control unit 160 controls the delay time of the delay block 120 in response to the detected temperature/voltage variation information from the temperature/voltage variation detector block 180. The delay time of the delay block 120 may be affected during operation by temperature and voltage variations, and the resulting variations of the delay time is corrected by the control unit 160 according to temperature and voltage variation information from the block 180.

As understood from the above description, the present delay signal generator circuit 100 generates a delay clock signal CLK1_¼DLY using a delay block consisting essentially of a series of inverters instead of a DLL circuit. Yet, present delay signal generator circuit 100 is capable of producing a stable delay clock signal despite PVT variations. In other words, the delay block 120 is set and maintained to have a delay time stably corresponding to a ¼ clock cycle.

In FIG. 3, the process variation detector block 140, the control unit 160 and the temperature/voltage variation detector block 180 constitute a delay control circuit 130, which samples an output signal CLK1_¼DLY of the delay block 120 in response to a high-to-low transition of the second clock signal CLK2 and controls (selects the output of) the delay block 120 according to the sampled value so that the actual delay time of the output signal CLK1_¼DLY from the delay block 120 is increased or decreased until it equals ¼ of the period of CLK1. In other words, the delay control circuit is configured to calibrate the actual delay time of the output CLK1_¼DLY of delay block 120. The delay control circuit 130 can dynamically control (select) the output of delay block 120 according to changes in temperature/voltage conditions. In alternative embodiments of the present invention, an inverted version of the second clock signal CLK2 can be used. In such a case, the process variation detector block 140 operates in synchronization with a low-to-high transition of the inverted version of the second clock signal CLK2.

Figure 4:
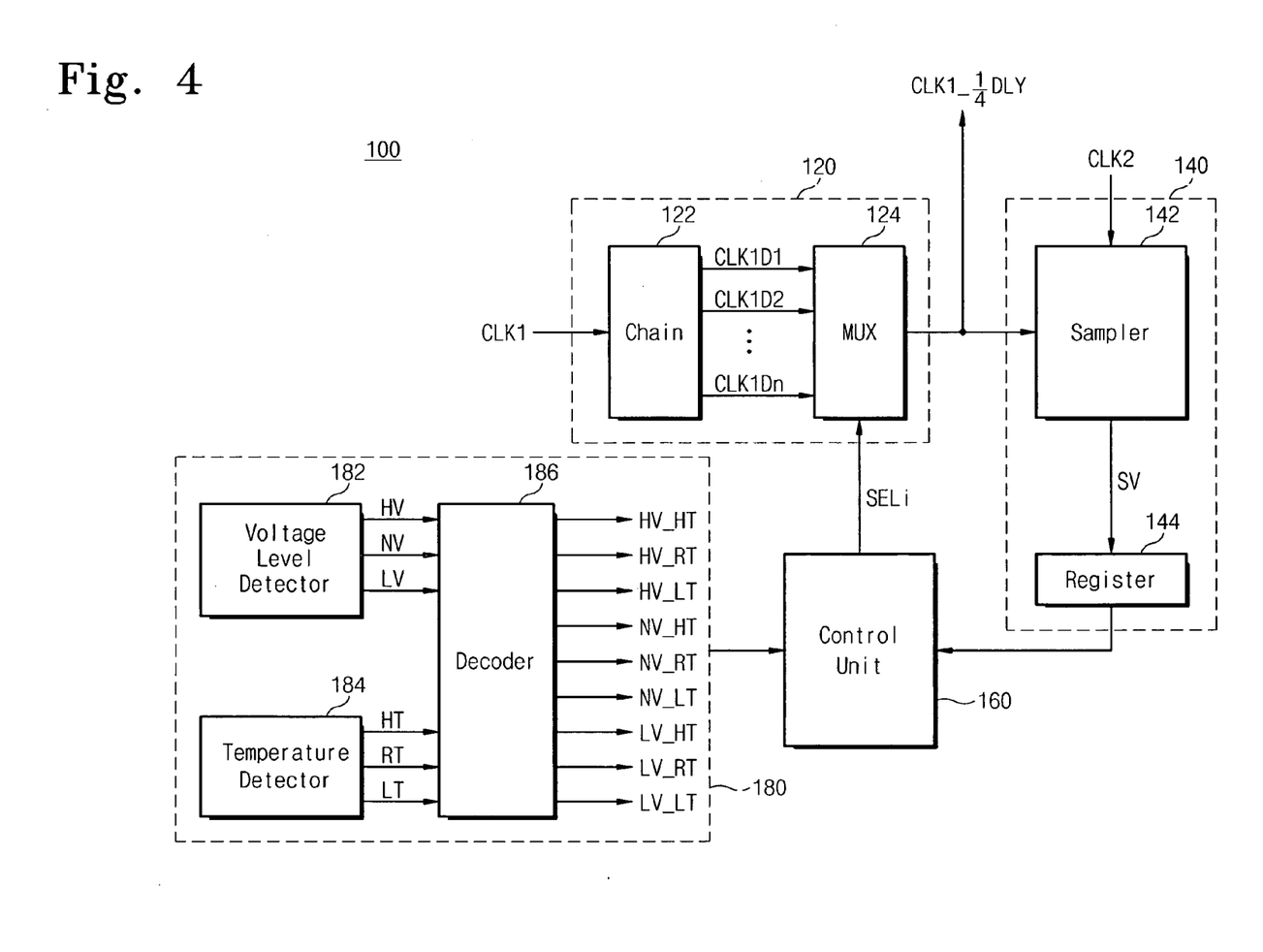
FIG. 4 is a schematic block diagram showing a delay signal generator circuit in FIG. 3 according to an exemplary embodiment of the present invention.

FIG. 4 is a block diagram showing circuit details of an exemplary implementation of the delay signal generator circuit 100 of FIG. 3.

Figure 5:
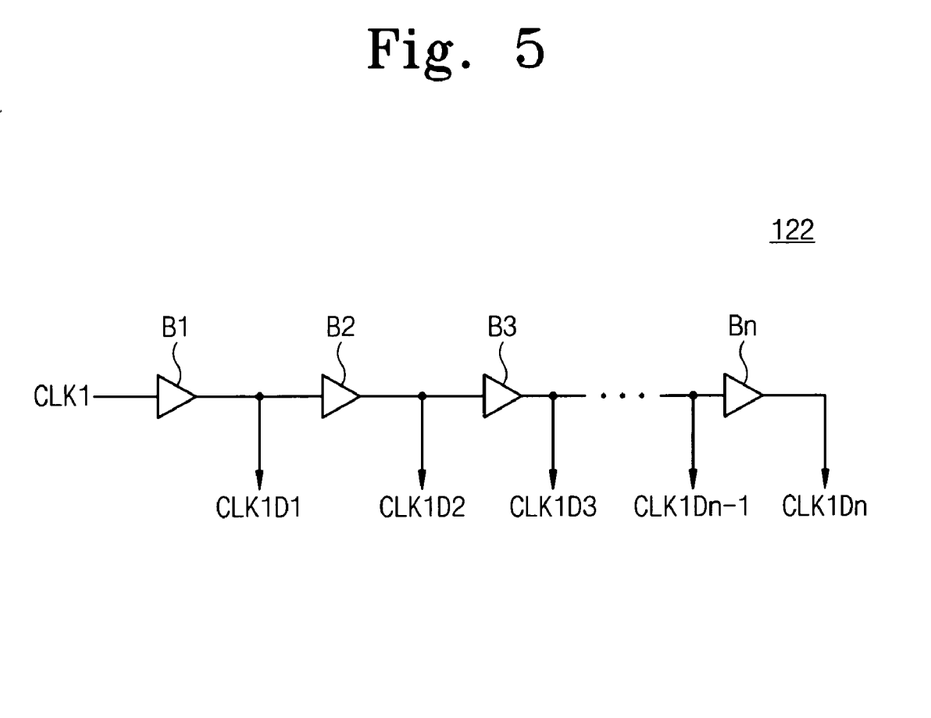
FIG. 5 is a circuit diagram showing an inverter chain in the delay signal generator circuit of FIG. 4.

Referring to FIGS. 4 and 5, the delay block 120 includes an inverter-based delay circuit (an inverter chain, i.e., a plurality of inverters connected in series) 122 and a multiplexer 124. Each of the plurality of inverters connected in series in the inverter chain (delay circuit) 122 sequentially delays a first clock signal CLK1 and may have an output node so as to generate a plurality of delay signals (e.g., CLK1D1–CLK1Dn). The delay circuit (inverter chain) 122 may be characterized as a plurality of (non-inverting) buffers B1–Bn connected in series as illustrated in FIG. 5, wherein each of the buffers B1–Bn comprises and may consist essentially of a pair of inverters. The buffers ideally have the same delay time relative to each other, but in alternative embodiments of the invention, the respective delay times of the buffers B1–Bn can be different, due for example to practical process conditions. The multiplexer 124 selects one of the delay signals CLK1D1–CLK1Dn in response to select signals SELi (or a select code) from the control unit 160. The selected delay signal is outputted as a delay clock signal CLK1_¼DLY.

Still referring to FIG. 4, a process variation detector block 140 includes a sampler 142 and a register 144. The sampler 142 samples the output signal (CLK1_¼DLY ) of the multiplexer 124 in response to a high-to-low transition of the second clock signal CLK2. Thus, the sampler 142 samples an output signal of the multiplexer 124 whenever the second clock signal CLK2 transitions from a high level to a low level. The sampled values (of CLK1_¼DLY) are sequentially stored in the register 144. The control unit 160 generates the select code SELi based upon sampled values (of CLK1_¼DLY) within the register 144. A select code SELi value is increased or decreased based upon the sampled values (of CLK1_¼DLY). Increasing of the select code value SELi has the effect of increasing the delay time of the output signal of the multiplexer 124 (CLK1_¼DLY) by selecting a more delayed signal from among the outputs of the plurality of (non-inverting) buffers B1–Bn. On the other hand, decreasing the select code value SELi has the effect of decreasing the delay time of the output signal of the multiplexer 124 (CLK1_¼DLY. A finally selected output signal of the delay block 120 is delayed by a ¼ clock cycle relative to the first clock signal CLK1 as the result of increasing or decreasing the select code value SELi during the setup interval in order to compensate for process variations.

Power supplied to generate the second clock signal CLK2 supplied to the sampler 142 may be cut off after the setup interval (or after the delay time of a delay signal from the delay block 120 is set to the intended ¼ clock cycle relative to the first clock signal CLK1). Thus, after the setup interval, the sampler 142, (and the process variation detector block 140) preferably does not operate. The delay time of the delay block 120 set during the setup interval is maintained by the control unit 160. In alternative embodiments of the invention, the sampler 142 may be configured to perform a sampling operation at a low-to-high transition of the clock signal CLK2. In this case, an inverted version of the second clock signal CLK2 is applied to the sampler 142.

The temperature/voltage variation detector block 180 includes a voltage level detector 182, a temperature detector 184, and a decoder 186. The voltage level detector 182 detects the voltage level of the power supply voltage of either the delay signal generator circuit 100 or an integrated circuit device (e.g., DDR memory device) including the delay signal generator circuit 100. The voltage level detector 182 outputs voltage detection signals HV, NV and LV as voltage detection indicators. "NV" indicates a normal (reference) operating voltage (e.g., 3.3V or 1.8V), "HV" indicates a voltage higher than the reference voltage, and "LV"

indicates a voltage lower than the reference voltage. An exemplary voltage level detector is disclosed in U.S. Pat. No. 6,577,166 titled "VOLTAGE LEVEL DETECTOR AND VOLTAGE GENERATOR USING THE SAME", the disclosure of which is hereby incorporated herein by reference. Alternative embodiments of the invention may incorporate known voltage detectors.

The temperature detector 184 detects a temperature of either the delay signal generator circuit 100 or an integrated circuit device including the delay signal generator circuit 100, and outputs voltage detection signals HT, RT and LT as a detection result. "RT" indicates a room temperature, "HT" is a higher temperature than the RT, and "LT" is a lower temperature than the RT. An exemplary temperature detector is disclosed in U.S. Pat. No. 6,442,500 titled "DEVICES FOR CONTROLLING TEMPERATURE INDICATIONS IN INTEGRATED CIRCUITS USING ADJUSTABLE THRESHOLD TEMPERATURES", the disclosure of which is hereby incorporated herein by reference. The decoder 186 decodes output signals of the detectors 182 and 184 to output decoded signals HV_HT, HV_RT, HV_LT, NV_HT, NV_RT, NV_LT, LV_HT, LV_RT, and LV_LT. As temperature/voltage variation information, one of the decoded signals is activated.

The control unit 160 adjusts a select code value according to the temperature/voltage variation information from the detector block 180 after the setup interval. Thus, a delay time of the delay block 120 set during the setup interval may be revised according to the temperature/voltage variation information from the detector block 180. The actual delay time of the delay signal CLK1_¼DLY from the delay block 120 which has been calibrated to compensate for the process variation can be changed by temperature and voltage variations, which is compensated for by the control unit 160 according to the temperature/voltage variation information from the detector block 180. As a result, the deviation of the delay time of the delay block 120 due to PVT variations may be automatically corrected for by the process variation detector block 140, the control unit 160, and the temperature/voltage variation detector block 180.

Persons skilled in the art will recognize that in the disclosed exemplary embodiment of the present invention, adjustment by the control unit 160 can be performed by use of applications specific hardware, such as a well-known state machine, or by software executed by a processor.

Figure 6:
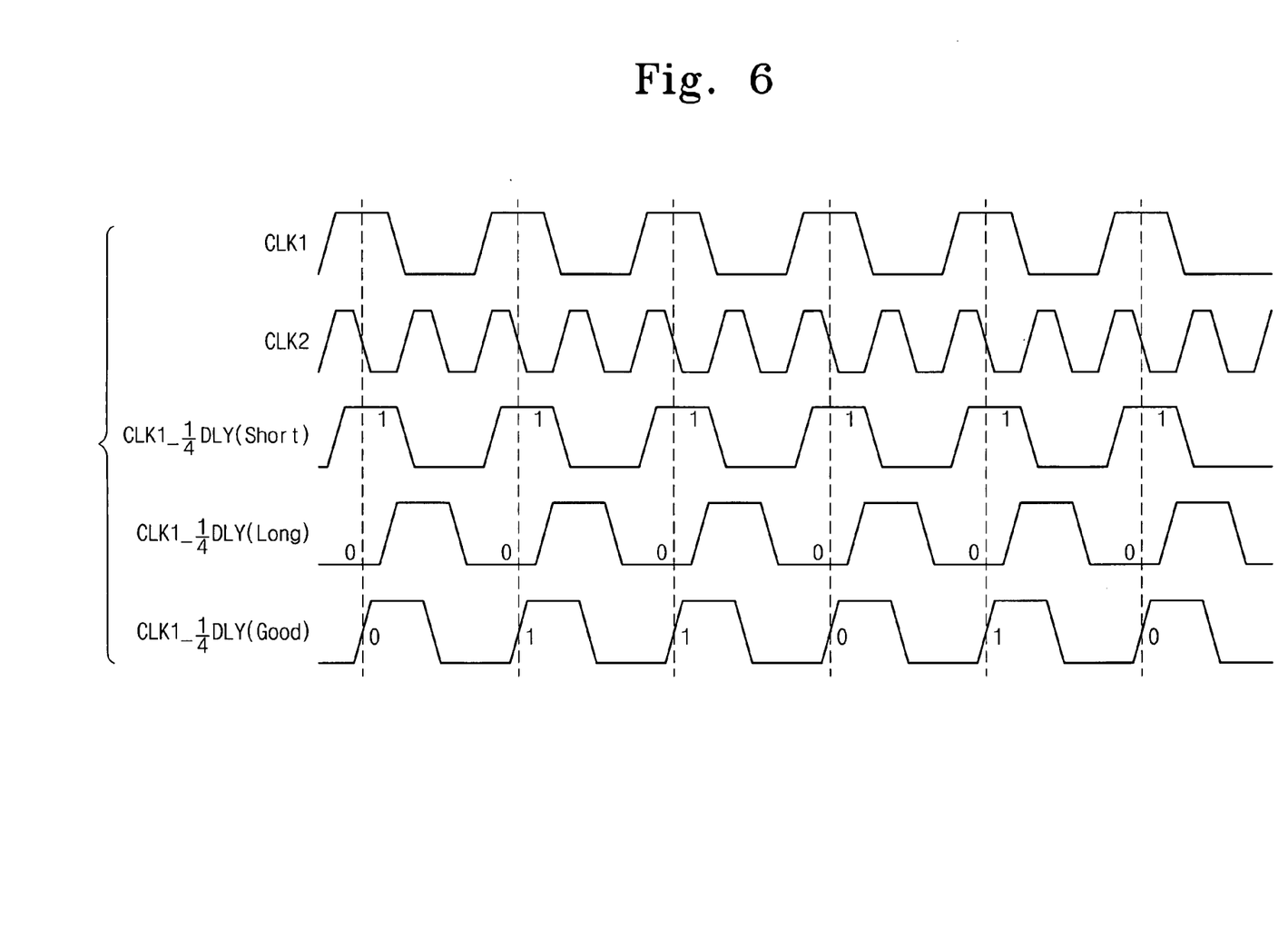
FIG. 6 is a timing diagram for describing an operation of the delay signal generator circuit of FIG. 3.

FIG. 6 is a timing diagram for describing an operation of the exemplary delay signal generator circuit 100 of FIG. 4. The present delay signal generator circuit 100 is designed to generate a delay clock signal CLK1_¼DLY that is delayed by a ¼ clock cycle relative to a first clock signal CLK1. Specifically, the present delay signal generator circuit 100 stably produces the delay clock signal CLK1_¼DLY using an inverter chain (instead of a DLL circuit) despite PVT variations. The internal operation of the delay signal generator circuit 100 will be more fully described with reference to the timing diagram of FIG. 6.

As described above, the present delay signal generator circuit 100 calibrates the delay time to compensate for process variations, and then dynamically revises the delay time to correct for changes in the delay time due to temperature and voltage variations.

To adjust the delay time to compensate for process variations, an inverter chain 122 in FIG. 4, comprised of a plurality of inverters connected in series (e.g., B1, B2, B3 etc. as shown in FIG. 5), generates a plurality of delay signals CLK1D1–CLK1Dn (see FIG. 5) by sequentially delaying the first clock signal CLK1. Meanwhile, a control unit 160 in FIG. 4 outputs a select code SELi so as to select one of the delay signals (e.g., one of CLK1D1–CLK1Dn). A multiplexer (124 in FIG. 4) selects the delay signal (e.g., one of CLK1D1–CLK1Dn) to be the output CLK1_¼DLY of the delay signal generator circuit 100 in response to the select code SELi. It will be apparent to persons skilled in the art that the control unit 160 can output the select code SELi so as to select a delay signal having the shortest delay time, (i.e., CLK1D1). On the other hand, it will be apparent to persons skilled in the art that the control unit 160 can output the select code SELi so as to select a delay signal having the longest delay time, (i.e., CLK1Dn).

A sampler (142 in FIG. 4) latches/samples the selected delay signal (e.g., one of CLK1D1–CLK1Dn) in response to a high-to-low transition of a second clock signal CLK2. As described above, the second clock signal CLK2 has half the period (twice the frequency) of the first clock signal CLK1. The sampled value is stored in register 144 in FIG. 4. During the set up interval, the control unit 160 generates the select code SELi based upon the stored values in the register 144 so that the delay time of a selected delay signal CLK1_¼DLY is increased gradually up to ¼ clock cycle.

The above-described operation continues to be performed during a given time interval (e.g., a setup interval) as follows: As illustrated in FIG. 6, if a value stored in the register 144 is 1, as illustrated in FIG. 6, the actual delay time of a delay clock signal CLK1_¼DLY is shorter than a ¼ clock cycle. In that case, the control unit 160 generates a select code SELi so that the delay time of the delay clock signal CLK1_¼DLY becomes longer. As the delay time is increased, the sampled value in the register 144 will transition from 1 to 0; As illustrated in FIG. 6, if the stored value in the register 144 is 0, the actual delay time of the delay clock signal CLK1_¼DLY is longer than a ¼ clock cycle. In that case, the control unit 160 generates the select code SELi so that a delay time of the delay clock signal CLK1_¼DLY becomes shorter. As the delay time of the CLK1_¼DLY is adjusted (longer or shorter), by repeating of the above-described operations, the stored value in the register 144 develops a random pattern value where 1 and 0 are arranged randomly. This random pattern value indicates that the delay clock signal CLK1_¼DLY is delayed by approximately ¼ clock cycle relative to the first clock signal CLK1. Thus, the delay block 120 is calibrated to have a delay time approximately equal to the ¼ clock cycle regardless of variations in process.

After a delay time of the delay block 120 is fixed by the above-described operations, (i.e., after the setup interval), the supply of the second clock signal CLK2 may be cut off ,e.g., to reduce power consumption by the sampler 142.

After the setup interval, the control unit 160 may adjust the select code value SELi based upon temperature/voltage variation information from the temperature/voltage variation detector block 180. Thus, the delay time of the delay block 120 set during the setup interval is revised based upon the temperature/voltage variation information from the detector block 180. In other words, the delay time of the delay block 120 already calibrated for process variations may be again adjusted to compensate for variations in temperature and/or voltage during operation. The control unit 160 stores values used to determine how much the select code value SELi should be increased/decreased to compensate for temperature/voltage variations. When temperature/voltage variation information is received from the temperature/voltage variation detector block 180, the control unit 160 generates a select code value corresponding to the value of the received information among the stored values. When during operation the temperature and voltage conditions change, the delay time of the output of the delay block 120 can be adjusted (back to approximately ¼ clock cycles) through the above-described operations.

As a result, the variation of the actual delay time of the output of the delay block 120 caused by PVT variations is automatically revised by the control unit 160 cooperating with the temperature/voltage variation detector block 180.

Figure 7:
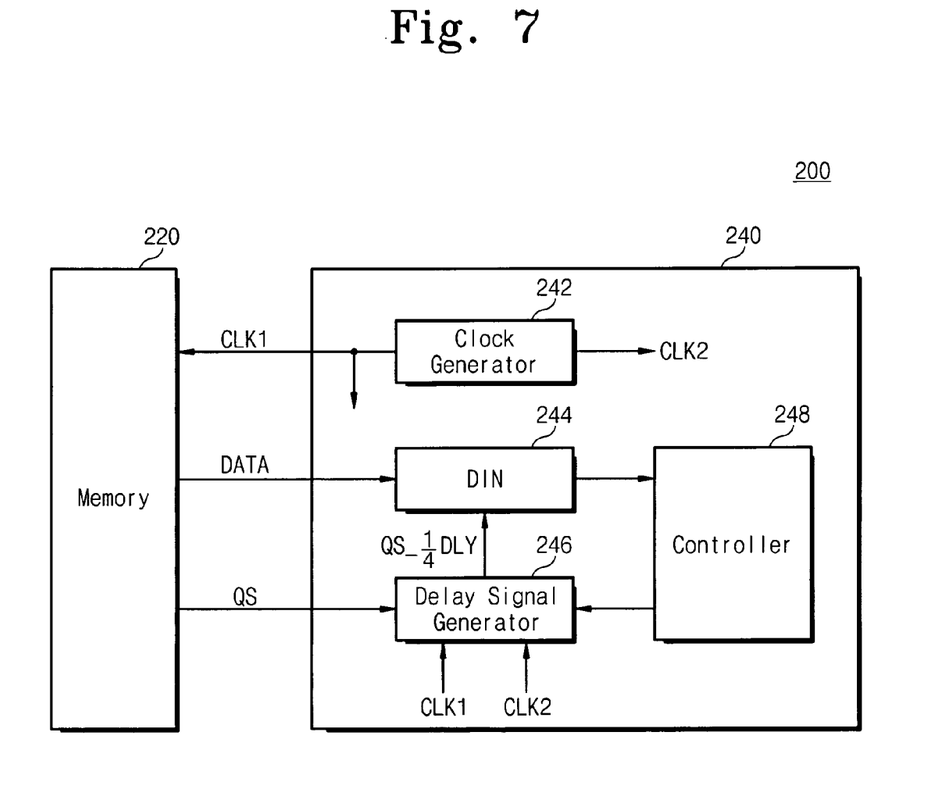
FIG. 7 is a schematic block diagram showing a memory system including a delay signal generator circuit in accordance with an embodiment of the invention.

FIG. 7 is a schematic block diagram showing a memory system 200 that includes an alternative delay signal generator circuit 246 within a memory controller 240, according to another embodiment of the invention.

Figure 8:
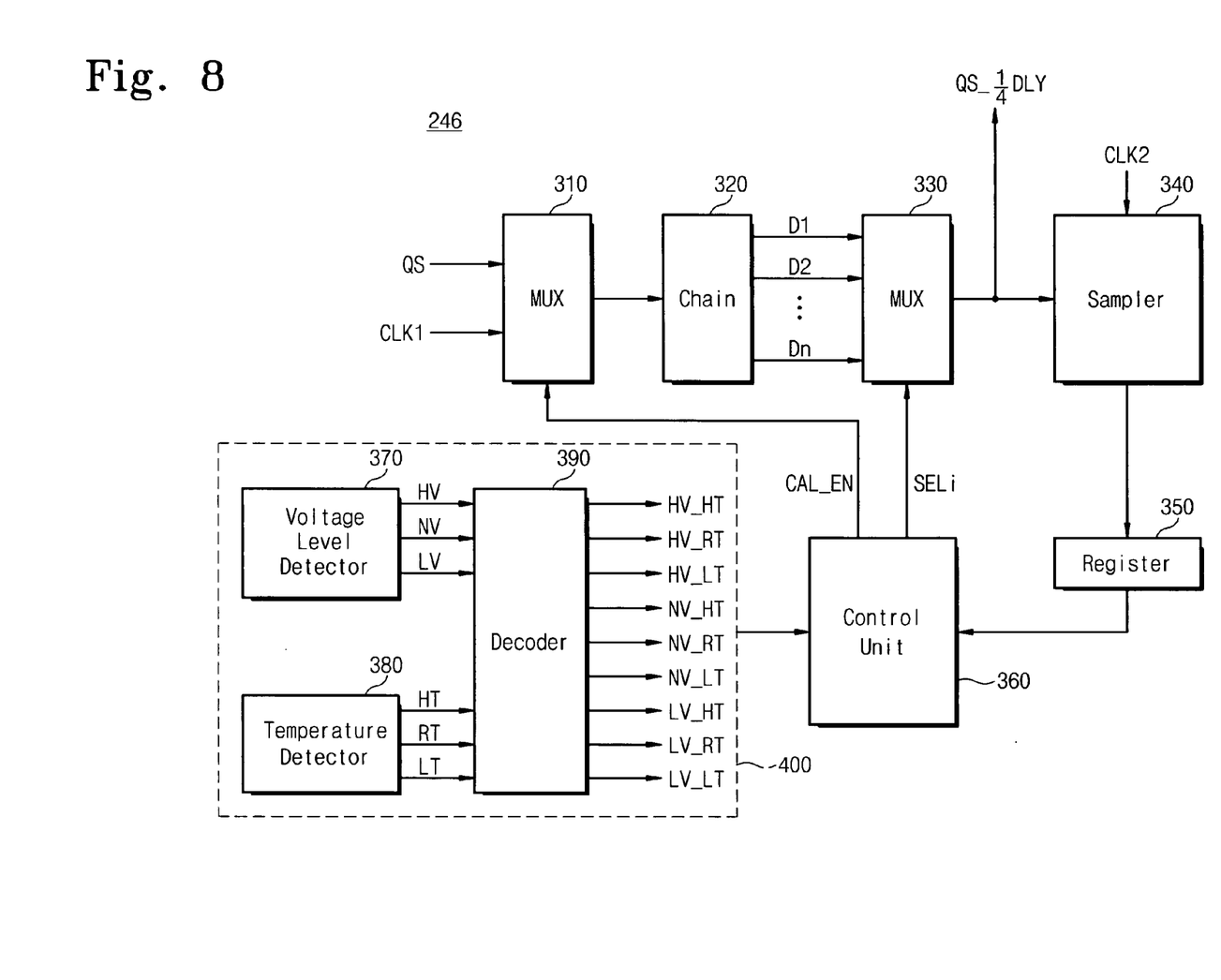
FIG. 8 is a block diagram showing details of the delay signal generator circuit in FIG. 7.

FIG. 8 is a block diagram showing the details of the delay signal generator circuit 246 of FIG. 7.

Referring to FIG. 7, the present memory system 200 includes a memory 220 and a memory controller 240. The memory 220 preferably a DDR memory. During a read operation, the memory 220 internally generates a data strobe signal QS coinciding with a first clock signal CLK1 and outputs DATA, together with the data strobe signal QS, to the memory controller 240. The memory controller 240 fetches DATA in response to the data strobe signal QS. A positive-to-negative edge of the data strobe signal QS, as illustrated in FIG. 1, does not coincide with a positive-to-negative edge of the first clock signal CLK1. The active (positive-to-negative) edge of the data strobe signal QS precedes the a positive-to-negative edge of the first clock signal CLK1 by a ¼ clock cycle. As illustrated in FIG. 7, the memory controller 240 may include a clock generator circuit 242, a DATA input circuit 244, a delay signal generator circuit 246, and a controller 248. The clock generator circuit 242 generates a first and a second clock signal CLK1 and CLK2, and the second clock signal CLK2 has half the period of the period of the first clock signal CLK1. The DATA input circuit 244 receives DATA from the memory 220 in response to a delay clock signal QS_¼DLY. The delay clock signal QS_¼DLY is a signal that is delayed by a ¼ clock cycle relative to the data strobe signal QS. The delay clock signal QS_¼DLY may be generated by the delay signal generator 246 from (by delaying) the data strobe signal QS (or from the first clock signal CLK1). The delay signal generator circuit 246 preferably produces the delay clock signal QS_¼DLY from the first and second clock signals CLK1 and CLK2 and the data strobe signal QS.

Referring to FIG. 8, a multiplexer 310 selects one of the data strobe signal QS and the first clock signal CLK1 in response to an enable signal CAL_EN. For example, the multiplexer 310 selects the first clock signal CLK1 when the enable signal CAL_EN is activated (e.g., a logic High voltage) and the data strobe signal QS when it is inactivated (e.g., a logic Low voltage). The enable signal CAL_EN is preferably activated only during the setup interval. An inverter chain 320 generates a plurality of delay signals D1–Dn by sequentially delaying the output signal of the multiplexer 310. The multiplexer 330 selects one of the delay signals D1–Dn in response to select signal (or a select code) SELi output from a control unit 360. The selected delay signal (a selected one of D1–Dn) is outputted by the multiplexer 330 as the delay clock signal QS_¼DLY.

A sampler 340 samples the output signal QS_¼DLY of the multiplexer 330 in response to a high-to-low transition of the second clock signal CLK2. Sampled values of the output signal QS_¼DLY of the multiplexer 330 are sequentially stored in a register 350. The control unit 360 generates the select code SELi based upon the sampled values stored in the register 350. The select code value SELi is increased or decreased based upon to the sampled values. As the select code value SELi is increased, the delay time of the (selected) delay signal output by the multiplexer 330 is increased. On the other hand, as the select code value SELi is decreased, the delay time of the (selected) delay signal output by the multiplexer 330 is decreased. As described above, after the setup interval, supplying of the second clock signal CLK2 to the sampler 340 may be cut off (e.g., after the delay signal QS_¼DLY is stably set to correspond with a ¼ clock cycle delay with respect to the first clock signal CLK1). The delay signal QS_¼DLY selected (from among one of D1–Dn) during the setup interval is maintained as against variations due to changes in the temperature or voltage during operation by the control unit 360 cooperating with the detector block 400.

If the enable signal CAL_EN is inactivated (e.g., after the setup interval), the data strobe signal QS (instead of the first clock signal CLK1) is output (by the multiplexer 310) to the inverter chain 320. After the setup interval, the signal path of the inverter chain 320 has a delay time corresponding to a ¼ clock cycle delay with respect to the input (e.g., the data strobe signal QS) and the output of inverter chain 320. . Accordingly, the data strobe signal QS is delayed by ¼ clock cycle through the inverter chain 320, and the delayed data strobe signal QS signal is outputted (by the multiplexer 330) as the delay clock signal QS_¼DLY. While the data strobe signal QS is delayed ¼ clock cycle (e.g., by the selected inverters in the inverter chain 320), the positive-to-negative edges of the data strobe signal QS will coincide with those of the first clock signal CLK1. The delay clock signal QS_¼DLY is supplied to the DATA input circuit 244 in FIG. 7. Thus, the data input circuit 244 stably receives data from the memory 220 in response to the delay clock signal QS_¼DLY.

Still referring to FIG. 8, a voltage level detector 370 detects the voltage level of an operating voltage of the memory controller 240 (of FIG. 7) and outputs (activates) a selected one of voltage detection signals HV, NV and LV based on a voltage detection result. A temperature detector 380 detects the operating temperature of the memory controller 240 (of FIG. 7) and outputs (activates) a selected one of temperature detection signals HT, RT and LT based on the temperature detection result. A decoder 390 decodes the selected (activated) output signals of the detectors 370 and 380 to output (activate) a one of nine decoded signals HV_HT, HV_RT, HV_LT, NV_HT, NV_RT, NV_LT, LV_HT, LV_RT, and LV_LT. Based upon the temperature variation and voltage variation information, one of the decoded signals is activated (output). After the setup interval, the control unit 360 adjusts a select code value SELi based upon temperature variation and voltage variation information from the detector block 400. Thus, the delay time of the selected output QS_¼DLY of the inverter chain 320, which was initially calibrated to compensate for process variations during the setup interval, is again adjusted, but based upon temperature and voltage variation information from the detector block 400. In other words, a delay time of the selected output QS_¼DLY of the inverter chain 320 is revised first to correct for process variations, and later is adjusted by the control unit 360 in order to compensate for variations in the temperature or voltage indicated by the detector block 400.

The invention has been described using preferred exemplary d embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A delay signal generator circuit comprising:
 a delay circuit for sequentially delaying a first external input signal to generate a plurality of delay signals;
 a multiplexer for outputting a selected one of the plurality of delay signals as a delay signal generator output; and
 a delay control circuit for sampling the values of the delay signal generator output in response to a transition of a second external input signal;
 wherein the delay control circuit increases or decreases the delay time of the delay signal generator output based upon the sampled values, and
 the first external input signal is a first clock signal, and the second external input signal is a second clock signal, wherein the second clock signal has twice the frequency of the first clock signal.

2. The delay signal generator circuit of claim 1, wherein the transition of the second clock signal is a high-to-low transition.

3. The delay signal generator circuit of claim 1, wherein the delay circuit comprises a plurality of serially-connected inverters.

4. The delay signal generator circuit of claim 1, wherein the delay control circuit controls the multiplexer so that the selected one of a plurality of delay signals selected by the multiplexer is delayed by a ¼ cycle relative to the first clock signal.

5. The delay signal generator circuit of claim 4, wherein the delay control circuit controls the mutliplexer and if the delay time of a first one of the plurality of delay signals selected by the multiplexer is shorter than ¼ cycle relative to the first clock signal, then the multiplexer selects a second one of the plurality of delay signals wherein the delay time of the second one selected is greater than the delay time of the first one selected.

6. The delay signal generator circuit of claim 4, wherein the delay control circuit controls the delay circuit so that and if a delay time of a first delay signal selected from the delay circuit is longer than the ¼ cycle, then a delay time of the second delay signal selected from the delay circuit is decreased relative to the delay time of the first delay signal selected from the delay circuit.

7. The delay signal generator circuit of claim 1, wherein after a delay signal from the delay circuit is calibrated so as to be delayed by a ¼ cycle relative to the first clock signal, then the second clock signal is cut off for suspension of the sampling operation.

8. The delay signal generator circuit of claim 1, wherein the delay control circuit controls the multiplexer and the delay time of the delay signal generator output selected by the multiplexer is changed based upon voltage variation information.

9. The delay signal generator circuit of claim 1, wherein the delay control circuit controls the multiplexer and the delay time of the delay signal generator output selected by the multiplexer is changed based upon temperature variation information.

10. A delay signal generator circuit comprising:
 an inverter chain for sequentially delaying a first input signal to generate a plurality of delay signals;
 a first selector circuit for selecting one of the delay signals in response to a select code;
 a sampler circuit for sampling the selected delay signal in response to a transition of a second input signal; and
 a control circuit for generating the select code based upon the sampled values so that the selected delay signal is delayed by a ¼ cycle relative to the first input signal.

11. The delay signal generator circuit of claim 10, wherein the first input signal is a first clock signal, and wherein the second input signal is a second clock signal, wherein the second clock signal has twice the frequency of the first clock signal.

12. The delay signal generator circuit of claim 11, further comprising a second selector circuit that selects one of the first clock signal and a third input signal in response to a flag signal and outputs the selected one of the first clock signal and the third input signal to the inverter chain.

13. The delay signal generator circuit of claim 11, wherein the control circuit generates a flag signal indicating a setup interval during which the selected delay signal is calibrated to be delayed by ¼ cycle relative to the first input signal.

14. The delay signal generator circuit of claim 12, wherein the second selector circuit outputs the first clock signal to the inverter chain during the setup interval and wherein the second selector circuit outputs the third external input signal to the inverter chain after the setup interval.

15. The delay signal generator circuit of claim 11, further comprising a voltage variation detector circuit for detecting voltage variations.

16. The delay signal generator circuit of claim 11, further comprising a temperature variation detector circuit for detecting temperature variations.

17. The delay signal generator circuit of claim 14, wherein the control circuit generates the select code in response to a detection result of each of a voltage variation detector circuit and a temperature variation detector circuit so that selected delay signal is selected to compensate for variations of the temperature and voltage.

18. The delay signal generator circuit of claim 12, wherein supplying of the first and second clock signals is cut off after the setup interval.

19. The delay signal generator circuit of claim 10, wherein the transition of the second input signal is a high-to-low transition.

20. A memory system comprising:
 a memory for outputting data along with a data strobe signal coinciding with a first clock signal; and
 a memory controller for receiving the data from the memory in response to the data strobe signal, wherein the memory controller comprises:
  a data input circuit for receiving the data in response to a data input clock signal;
  a delay circuit for sequentially delaying the first clock signal and to generate from the first clock signal a plurality of delay signals, a selected one of the delay signals being output as the data input clock signal; and
  a delay control circuit for sampling data input clock signal in response to a transition of a second clock signal having twice a frequency of the first clock signal, the delay control circuit controlling the selection by the delay circuit based upon the sampled value.

21. The memory system of claim 20, wherein the transition of the second clock signal has a high-to-low transition.

22. The memory system of claim 20, wherein the delay circuit comprises serially-connected inverters.

23. The memory system of claim 20, wherein the delay circuit consists essentially of serially-connected inverters and a multiplexer.

24. The memory system of claim 20, wherein the delay control circuit controls the delay circuit so that a delay signal from the delay circuit is delayed by a ¼ cycle relative to the first clock signal.

25. The memory system of claim 21, wherein the delay control circuit controls the delay circuit so that a delay time of the delay signal is increased if the delay time of a delay signal from the delay circuit is shorter than ¼ cycle relative to the first clock signal.

26. The memory system of claim 21, wherein the delay control circuit controls the delay circuit and if the delay time of a delay signal from the delay circuit is greater than ¼ cycle relative to the first clock signal then so the delay time of the delay signal is decreased.

27. The memory system of claim 20, wherein after a setup interval during which a delay signal from the delay circuit was calibrated so as to be delayed by a ¼ cycle relative to the first clock signal, the sampling operation is suspended.

28. The memory system of claim 27, wherein the delay circuit delays a third input signal instead of the first clock signal, and generates from the third input signal a plurality of delay signals, a selected one of the delay signals being output.

29. The memory system of claim 20 adapted to cut off supplying of the second clock signal for suspension of the sampling operation after a setup interval during which a delay signal from the delay circuit is calibrated so as to be delayed by a ¼ cycle relative to the first clock signal.

30. The memory system of claim 29, wherein after the setup interval, the delay control circuit controls the delay circuit so that a delay time of a delay signal from the delay circuit is changed based upon temperature and voltage variation information.

31. A memory system comprising:
a memory adapted to output data and a data strobe signal coinciding with a first clock signal; and
a memory controller for receiving the data from the memory in response to the data strobe signal, wherein the memory controller comprises:
  a data input circuit for receiving the data in response to a data input clock signal;
  an inverter chain for sequentially delaying the first clock signal to generate a plurality of delay signals;
  a first selector circuit for selecting one of the plurality of delay signals as the data input clock signal in response to a select code;
  a sampler circuit for sampling the selected delay signal in response to a second clock signal, the second clock signal having twice the frequency of the first clock signal; and
  a control circuit for generating the select code based upon the sampled value so that the selected delay signal is delayed by a ¼ cycle relative to the first clock signal.

32. The memory system of claim 31, wherein the control circuit generates a flag signal indicating a setup interval during which the selected delay signal is calibrated so as to be delayed by ¼ cycle relative to the first clock signal.

33. The memory system of claim 31, further comprising a second selector circuit that selects one of the first clock signal and an external input signal in response to the flag signal and outputs the selected signal to the inverter chain for sequentially delaying the selected signal to generate the plurality of delay signals.

34. The memory system of claim 33, wherein the second selector circuit outputs the first clock signal to the inverter chain during the setup interval and wherein the second selector circuit outputs the external input signal to the inverter chain after the setup interval.

35. The memory system of claim 31, further comprising a voltage variation detector circuit for detecting voltage variations.

36. The memory system of claim 35, further comprising a temperature variation detector circuit for detecting temperature variations.

37. The memory system of claim 36, wherein the control circuit generates the select code in response to a detection result of the voltage variation detector circuit and the temperature variation detector circuit, so that a delay signal of the selected delay signal is changed to compensate for temperature and voltage variations.

38. The memory system of claim 31, wherein supplying of the first and second clock signals is cut off after the setup interval.

39. A delay signal generator circuit comprising:
a first selector circuit for selecting one of an input signal and a first clock signal;
an inverter chain for sequentially delaying the selected signal output by the first selector circuit to generate a plurality of delay signals;
a second selector circuit for selecting one of the plurality of delay signals in response to a select code;
a sampler circuit for sampling the selected delay signal in response to a transition of a second clock signal, the second clock signal having twice the frequency of the first clock signal; and
a control circuit for generating the select code based upon the sampled value so that the selected delay signal is delayed by ¼ cycle relative to the first clock signal,
wherein the control circuit controls the first selector circuit so that the first clock signal is selected during a setup interval and the input signal is selected after the setup interval.

40. The delay signal generator circuit of claim 39, further comprising a voltage variation detector circuit for detecting voltage variations.

41. The delay signal generator circuit of claim 39, further comprising a temperature variation detector circuit for detecting temperature variations.

42. The delay signal generator circuit of claim 39, wherein the control circuit generates the select code according to a detection result of a voltage variation detector circuit and a temperature variation detector circuit after the setup interval, so that a delay signal of the selected delay signal is changed to compensate for temperature and voltage variations.

43. The delay signal generator circuit of claim 39, wherein the transition of the second clock signal is a high-to-low transition.

44. A method of generating a delay signal comprising the steps of:
sequentially delaying a first clock signal to generate a plurality of delay signals;
selecting one of the plurality of delay signals in response to a select code;
generating the select code so that the selected delay signal is delayed by a ¼ cycle relative to the first clock signal.

45. The method of claim 44, further comprising sampling the selected delay signal in response to a transition of a second clock signal, the second clock signal having twice the frequency of the first clock signal; wherein the select code is generated based upon the sampled values.

46. The method of claim 44, wherein the transition of the second clock signal is a high-to-low transition.

47. The method of claim 46, wherein the transition of the second clock signal is a low-to-high transition.

48. The method of claim 44, wherein after the selected delay signal has been calibrated so as to be delayed by a ¼ cycle relative to the first clock signal, the select code is changed based upon temperature and voltage variation information.

* * * * *